(12) United States Patent
Gilson

(10) Patent No.: US 6,526,564 B1
(45) Date of Patent: Feb. 25, 2003

(54) METHOD AND APPARATUS FOR REFERENCE DISTRIBUTION AERIAL IMAGE FORMATION

(75) Inventor: Greyson H. Gilson, Nashua, NH (US)

(73) Assignee: Mulith, Inc., Nashua, NH (US)

( * ) Notice: Subject to any disclaimer, the term of this patent is extended or adjusted under 35 U.S.C. 154(b) by 0 days.

(21) Appl. No.: 09/549,882

(22) Filed: Apr. 17, 2000

Related U.S. Application Data

(60) Provisional application No. 60/129,440, filed on Apr. 15, 1999.

(51) Int. Cl.[7] ............................................. G06F 17/50
(52) U.S. Cl. ........................... 716/21; 716/19; 382/144; 382/145
(58) Field of Search ................................. 382/145, 144; 716/1–21

(56) References Cited

U.S. PATENT DOCUMENTS 5,680,588 A * 10/1997 Gortych et al. ................ 716/19
6,282,309 B1 * 8/2001 Emery ......................... 382/145

* cited by examiner

*Primary Examiner*—Vuthe Siek
*Assistant Examiner*—Helen Rossoshek
(74) *Attorney, Agent, or Firm*—Devine, Millinet & Branch, P.A.; Paul C. Remus; Todd A. Sullivan

(57) ABSTRACT

A coherent laser beam is split into an illumination beam and a reference beam. A portion of the illumination beam is passed through, or reflected off of, a subject to create a subject distribution, and a portion of the reference beam is passed through a pinhole, or reflected off a point-like reflector, to produce a reference distribution. An imaging system is used to form an aerial image of the subject distribution and the reference distribution. The resulting aerial image of the subject distribution exhibits improved resolution, depth of field and field size.

18 Claims, 6 Drawing Sheets

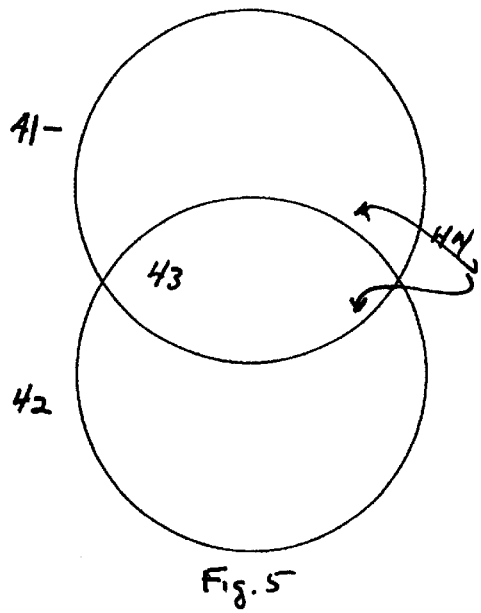
Fig. 5
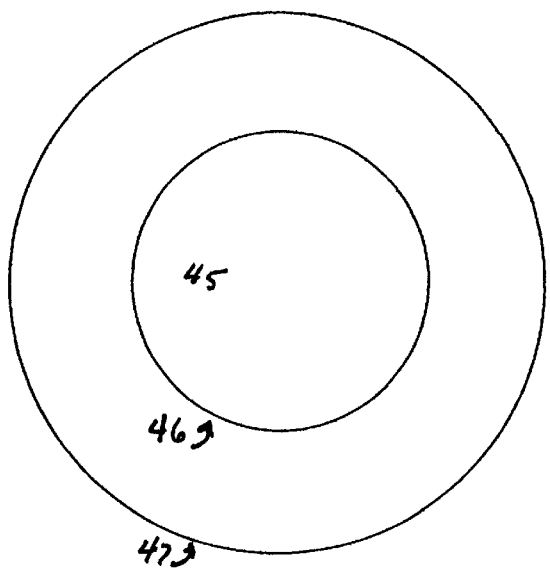
Fig. 6
Fig. 7

METHOD AND APPARATUS FOR REFERENCE DISTRIBUTION AERIAL IMAGE FORMATION

STATEMENT OF RELATED CASES

This application claims the benefit of U.S. Provisional Application No. 60/129,440, filed Apr. 15, 1999.

FIELD OF THE INVENTION

The present invention relates generally to a method and apparatus for aerial image formation. More specifically, it relates to an improved system for reference distribution aerial image formation for use in both microimagery and microscopy. More specifically, still, it relates to an improved system for microimagery and microscopy with both increased fixed size depth of field and no fundamental resolution limit.

BACKGROUND OF THE INVENTION

The continued progress of semiconductor technology is dependent on making semiconductor devices faster and smarter. This is, in turn, dependent on shrinking the size of transistors squeezed onto a silicon wafer. For example, transistors with an electrical channel, or gate, measuring between 0.1 and 0.2 micron, and smaller, are now planned.

However, it has become increasingly difficult to make smaller transistors. At these smaller dimensions, the photographic process for developing a circuit image on the surface of a silicon wafer, photolithography, starts to falter. In photolithography, light is channeled through a mask, a transparent plate covered with a circuit pattern. The light then moves through an imaging system that demagnifies the circuit pattern and projects an aerial image of the circuit pattern onto a silicon wafer.

The separation of two points in an aerial image is limited to a certain minimum distance, related to the wavelength of the light used, known as the resolution limit. Moreover, before reaching the resolution limit, efforts to increase resolution, by increasing the effective aperture of the imaging system decrease the depth of field of the aerial image.

In addition the separation of two points in an object that can be distinguished when observed by means of optical microscopy is also limited in the same way to a certain minimum distance also known as the resolution limit. Efforts to increase resolution in microscopy also lead the same way to a decrease in the depth of field of the aerial image.

Traditionally, aerial images of a subject are formed by using a distribution of light that propagates from the subject alone. In the present invention, a distribution of light—a reference distribution—which is usually (but not necessarily) separated from the subject is introduced. An aerial image of both the subject distribution and the reference distribution is formed. The present invention is a system for increasing both the field size and the depth of field of aerial images and removing resolution limits.

SUMMARY OF THE INVENTION

The present invention is a method and apparatus of reference distribution aerial image formation. It produces increased resolution, depth of field and field size in aerial image formation of a subject, which is used in microimagery, microscopy and other applications.

The present invention splits a coherent laser beam into an illumination beam and a reference beam. A portion of the illumination beam is passed through, or reflected off of, a subject in an object plane to create a subject distribution. A portion of the reference beam is passed through a pinhole, or reflected off a point reflector, in the object plane to produce a reference distribution. An imaging system is used to form an aerial image of the subject distribution and the reference distribution on an image plane. The resulting aerial image of the subject distribution exhibits resolution, depth of field and field size than a traditional aerial image formed of the subject distribution with the same imaging system.

IN THE DRAWINGS

FIG. 5 is a diagram of a plane wave pair overlap.

FIG. 6 is a diagram of a demarcation envelope and an overlap envelope.

FIG. 7 is a diagram of three isolated and illuminated points.

DETAILED DESCRIPTION OF THE INVENTION

I. Aerial Image Formation

Figure 1:
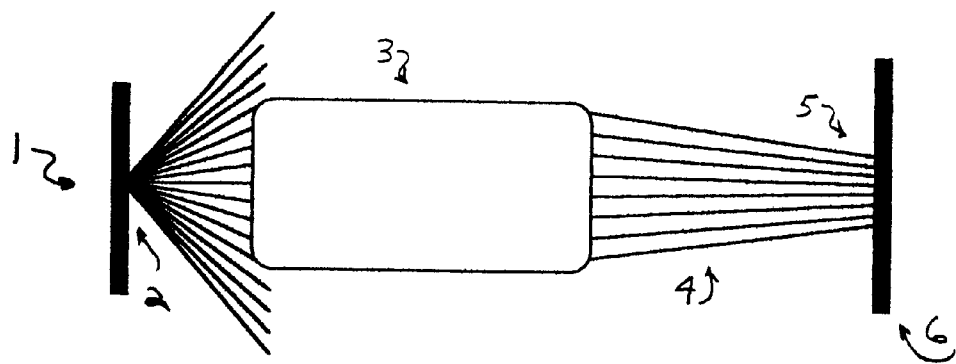
FIG. 1 is a schematic diagram of traditional aerial image formation.

Aerial image formation can be understood conceptually by referring to the apparatus illustrated in FIG. 1. Initially, light 1 that is transmitted through or reflected from a subject 2 forms a specific distribution at the subject. A portion of this light propagates, as a form of wave motion, away from the subject and then passes through an imaging system 3. Some of the light 4 that passes through the imaging system subsequently forms an aerial image 5 at the image plane 6. The aerial image is a distribution of light that closely resembles the initial distribution of light at the subject.

Figure 2:
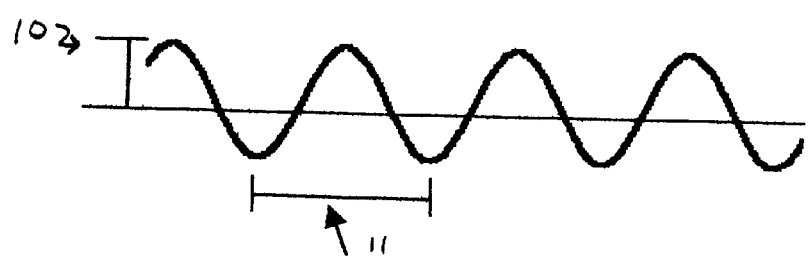
FIG. 2 is a schematic diagram of a sinusoidal component of a light distribution.

Light which ultimately forms an aerial image is distributed in a definite distribution at the subject. This distribution can be described mathematically as a constant component plus a sum of sinusoidal components, i.e., as a superposition of components. In cross-section, each of the sinusoidal components consists of a repeating pattern, as illustrated in FIG. 2. The maximum value which each sinusoidal component takes on is known as its amplitude 10. The length of the repeating pattern in each sinusoidal component is known as its spatial period 11; the number of spatial periods in a unit of distance is the component's spatial frequency, which is the reciprocal of the spatial period.

An infinite number of sinusoidal components is needed to describe most distributions of light. Furthermore, the various sinusoidal components involved are usually rotated and shifted relative to one another in very complicated ways. Fortunately, the mathematical methods of Fourier transform analysis are capable of dealing with all of these components and determining their superposition. Fourier transform analysis can be used to show that each of the various sinusoidal components needed to describe a distribution of light is associated with two points in the distribution of light. Furthermore, the spatial period of each sinusoidal component is equal to the distance between the two points with which it is associated. Also, two propagating plane wave fronts are associated with each such sinusoidal component.

Figure 3:
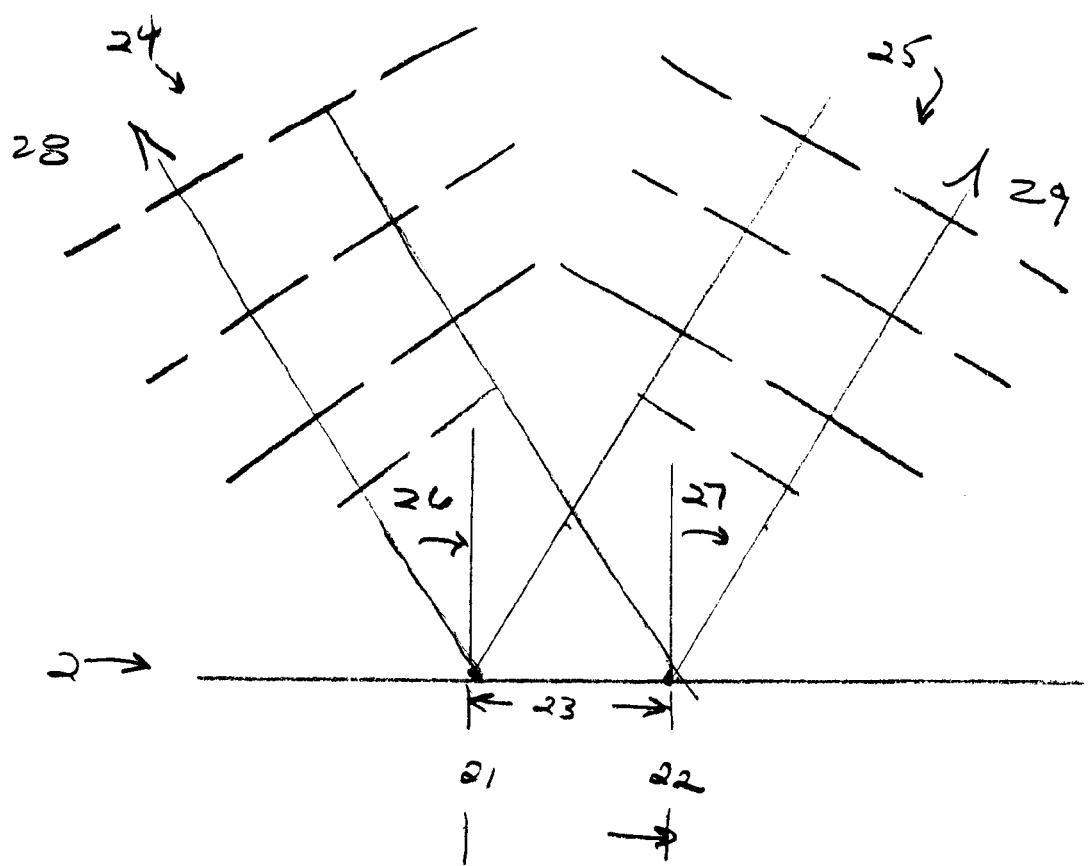
FIG. 3 is a diagram of the propagation of a plane wave pair associated with two points.

Thus, FIG. 3, illustrates the sinusoidal component associated with points 21 and 22 on the subject 2 separated by distance T (23), which is twice the spatial period of the sinusoidal component. It also shows the two propagating plane wave fronts 24 and 25 into which the sinusoidal component can be resolved. The angles θ (26) and (27) between the directions of propagation of each wave front 28 and 29 and a perpendicular to the subject are equal. For any such plane wave pair, $$\sin\theta = \lambda/T$$

Where is the wavelength of the light used.

The plane wave pair associated with any particular distribution of light at the subject behaves independently of any other plane wave pair. The spatial period of the sinusoidal component with which a plane wave pair is associated is the projection on the subject of the wavelength of the light used. The direction of propagation is necessarily such that one spatial period in the subject corresponds exactly to one wavelength of the light used. When the direction of propagation is parallel to the subject, θ equals 180°, the spatial period is equal to the wavelength of light used and no wave is propagated away from the subject. The non-propagating waves that do occur under these conditions are known as evanescent waves. Thus, sinusoidal components with spatial periods equal to or smaller than the wavelength of light used are associated with evanescent light waves that do not propagate away from the subject toward the imaging system. A plane wave pair that propagates away from the subject toward the imaging system is associated with each sinusoidal component (needed to describe the distribution of light at the subject) with spatial period larger than the wavelength of light used. These waves are intercepted by the imaging system and limited portions of their wavefronts pass through it.

Figure 4:
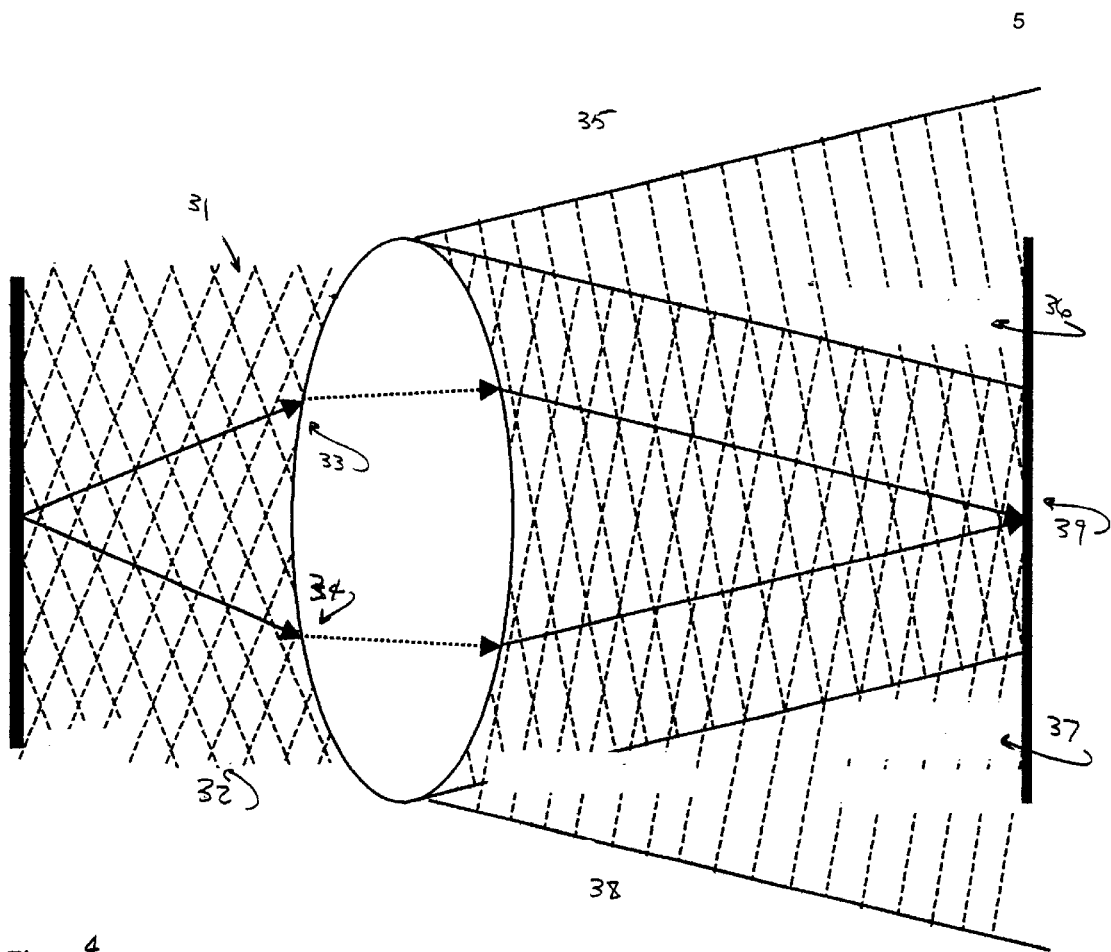
FIG. 4 is another diagram of the propagation of a plane wave pair.

The portion of every plane wave pair that contributes to aerial image formation passes from the subject through an imaging system and then to an aerial image as illustrated in FIG. 4. Once again, dashed lines perpendicular to the direction of propagation illustrate plane wavefronts 31 and 32 (the planes are perpendicular to the figure) associated with the two propagating waves. The direction of propagation is illustrated by arrows 33 and 34 (between the subject and the imaging system), a dotted arrow (inside the imaging system), and finally by a solid arrow (between the imaging system and the aerial image) for each wave. The wavefronts that pass through the imaging system are limited in extent (demarcated) by the imaging system; demarcation boundaries 35, 36, 37 and 38 are shown in the figure to illustrate this effect. After departing from the imaging system, each demarcated plane wave pair propagates to the aerial image 39.

At the aerial image, the two members of each plane wave pair combine to form a standing sinusoidal wave. The standing wave describes the sinusoidal component of the distribution of light at the aerial image with which the plane wave pair is associated, and is a demarcated version of the corresponding sinusoidal component of the distribution at the subject.

Upon departure from the imaging system, the spatial period of the sinusoidal component with which a plane wave pair is associated is the projection on the aerial image of the wavelength of the light used. The direction of propagation is necessarily such that one spatial period in the aerial image corresponds exactly to one wavelength of the light used. This spatial period is an imaged (enlarged, unchanged or reduced) version of the corresponding spatial period at the subject.

II. Image Area

Imaging systems are able to produce aerial images in a restricted region of space. A distribution of light that closely approximates an imaged (enlarged, unchanged or reduced) version of the corresponding distribution of light at the subject exists throughout this region.

A portion of a central plane, known as an image plane, exists within an aerial image. The various demarcated plane wave pairs that contribute to aerial image formation combine to produce standing waves on the image plane. The spatial periods of these standing waves are imaged versions of corresponding spatial periods of standing waves at the subject. Furthermore, the standing waves on the image plane are rotated and shifted relative to one another in the same complicated way as their counterparts at the subject are. Thus, the plane waves that contribute to aerial image formation do so very precisely on the image plane.

Overlap of a plane wave pair on an image plane is illustrated in FIG. 5, where the demarcation boundary of each member of the plane wave pair 41 and 42 is represented by a circle. The common area included inside both demarcation boundaries is designated as the overlap area 43. The overlap area is the portion of the image plane within which the members of the plane wave pair overlap; the overlap area is bounded by the overlap boundary 44.

Many plane wave pairs that have the same spatial period but that are rotated relative to one another may contribute to formation of a particular aerial image. The image area 45, enclosed by an overlap envelope 46 that surrounds the overlap areas of all such possible plane wave pairs, is shown in FIG. 6; the corresponding demarcated plane wave pair envelope 47 is also shown. The portion of the image plane within which plane wave pairs that have the same spatial period are able to overlap is, by definition, the image area associated with the spatial period.

Within the image area associated with its spatial period, each plane wave pair overlaps to produce a standing wave. The spatial period of the standing wave is the same as the spatial period of each member of the plane wave pair which produces it. On the image plane, the standing wave exists everywhere inside but nowhere outside the image area associated with its spatial period. A specific image area is associated with the spatial period of each sinusoidal component which contributes to aerial image formation. The image area is larger for large spatial periods than it is for small spatial periods. No image area exists for sufficiently small spatial periods. Plane wave pairs associated with sufficiently small spatial periods do not overlap on any portion of the image plane and consequently can not contribute to aerial image formation. The largest spatial period for which this occurs is the imaging system's spatial period cutoff. The spatial period associated with any sinusoidal component which contributes to aerial image formation is necessarily larger than the imaging system's spatial period cutoff.

III. Areas of Coherence

Fourier transform analysis, as indicated previously, can be used to show that each of the various sinusoidal components that form an aerial image is associated with two illuminated points in the aerial image. Illumination of these two points by light that is coherent is required.

Any portion of the subject which is illuminated by coherent light is known as an area of coherence. Formation of sinusoidal components occurs for pairs of points that exist within a particular area of coherence. Formation of other sinusoidal components occurs for pairs of points that exist within other areas of coherence. All of these sinusoidal components contribute to the distribution of light at the subject.

IV. Resolution Limits

Consider two illuminated points in a distribution of light at a subject. These two points are isolated when they are the only two points which exist within an area of coherence and neither point is inclined within another area of coherence. An aerial image of the two isolated and illuminated points can be formed by an imaging system only if the distance between the two points is sufficiently large.

Two isolated points in a subject which can be distinguished when observed by means of conventional optical microscopy are necessarily separated by a certain minimum distance known as the resolution limit for microscopy. When the distance between two points in a subject is less than or equal to the wavelength of light used, no light propagates away from the subject toward the imaging system, and no aerial image formation occurs.

Two isolated points in an aerial image which can be distinguished when produced by means of conventional optical microscopy are necessarily separated by a certain minimum distance known as the resolution limit for microscopy. The spatial period associated with any sinusoidal component which contributes to aerial image formation is necessarily larger than the imaging system's spatial period cutoff. Existence of the resolution limit for microimagery occurs as a consequence of the imaging system's spatial period cutoff.

Three isolated and illuminated points in a distribution of light at a subject are shown in FIG. 7; the three points are labeled A (51), B (52), and P (53) in the figure. The three points are isolated because they are the only three points that exist within a certain area of coherence, and none of the points is included within another area of coherence. The distance between any two of these points defines the spatial period associated with a sinusoidal component of the distribution of light at the subject.

The distance between points A and B is less than the resolution limit for the aerial image formation process involved. The sinusoidal component associated with points A and B does not, therefor, contribute to the formation of a corresponding sinusoidal component in the aerial image. Consequently, points A and B are not directly represented by corresponding points in the aerial image. The distance between the points A and P and the distance between the points B and P is larger than the resolution limit for the aerial image formation process involved. The sinusoidal component associated with points A and P contributes to the formation of a corresponding sinusoidal component in the aerial image. Similarly, the sinusoidal component associated with points B and P is also associated with the formation of a corresponding sinusoidal component in the aerial image. Consequently, the three points A, B, and P are represented by corresponding points in the aerial image. No resolution limit is associated with the separation of points A and B.

Any number of discrete illuminated points or a continuum of illuminated points can exist in a single area of coherence. Let any such collection of points be designated as R. All points in R can be so close together that the distance between any two of them is less than the resolution limit for the aerial image formation process involved. The sinusoidal component associated with any two of these points does not contribute to the formation of a corresponding sinusoidal component in the aerial image. Consequently, no point in R is directly represented by a corresponding point in the aerial image.

An additional illuminated point P, located in the area of coherence which includes R, can be introduced. Let the distance between P and each point in R be larger than the resolution limit for the aerial image process involved. The sinusoidal components associated with P and each point in R all contribute to the formation of corresponding sinusoidal components in the aerial image. Consequently, all the illuminated points in R and P are represented by corresponding points in the aerial image. No resolution limit is associated with the separation of points in R.

The amplitude of the sinusoidal component associated with P and any particular point in R is the same at P and at the point in R. The total amplitude at P is equal to the sum of the amplitudes of all the points in R. Consequently, the amount of light which illuminates R is the same as the amount of light which illuminates P.

V. Reference Distribution Aerial Image Formation

The present invention employs two distributions of light one from the subject, the subject distribution; and one introduced into the same plane, the reference distribution. The plane in which these two distributions of light exist is designated as the object plane. An aerial image of both the subject distribution and the reference distribution is made during the reference distribution aerial image formation process.

Sinusoidal components associated with one point in the subject distribution and one point in the reference distribution are formed by means of reference distribution aerial image formation. Points in the reference distribution are separated from the points in the subject distribution by distances which exceed the resolution limit involved. The sinusoidal components associated with these points have counterparts therefor, that contribute to aerial image formation. These contributions are sufficient to form an aerial image of the subject distribution and reference distribution combination. No known fundamental resolution limit is associated with reference distribution aerial image formation.

Figure 8:
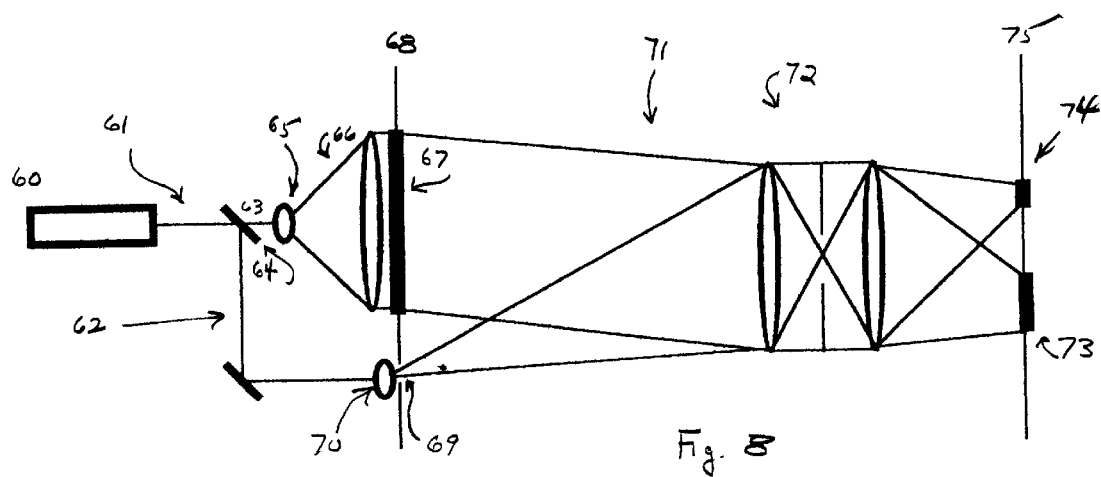
FIG. 8 is a schematic diagram of one preferred embodiment of the present invention.

A preferred embodiment of an apparatus for reference distribution aerial imaging is illustrated in FIG. 8. In this apparatus, a stable continuous-wave laser 60 that operates in the $TEM_{00}$ mode is utilized. A beam 61 of coherent quasi-monochromatic light which is linearly polarized perpendicular to the plane of FIG. 8 is produced by the laser. The laser beam is split into two beams—a reference beam 62 and an illumination beam 63—by a variable beam splitter 64. The irradiance of the reference beam relative to the illumination beam is controlled by adjusting the variable beam splitter.

Expansion and subsequent collimation of the illumination beam occurs as a result of its passage through an expansion lens 65 and a collimation lens 66. This beam is incident upon the subject 67 in the object plane 68. The reference beam is focused onto the reference pinhole 69 in the object plane 68 by means of the reference lens 70. Light passes through the reference pinhole 69 and transparent portions of the subject 67 to form a propagating optical disturbance 71 on the side of the object plane nearest to the imaging system 72. The reference pinhole has been identified as a reference distribution. The propagating optical disturbance 71 that forms on the side of the object plane nearest to the imaging system 72 propagates toward the imaging system 72. A portion of this optical disturbance arrives at the imaging system 72, which images (enlarges, leaves unchanged, reduces) it. This portion of the optical disturbance subsequently propagates through the imaging system 72. Some of this portion of the propagating optical disturbance 73 ultimately forms a subject distribution aerial image 73 and a reference distribution aerial image 74 at and near the image plane 75.

Figure 9:
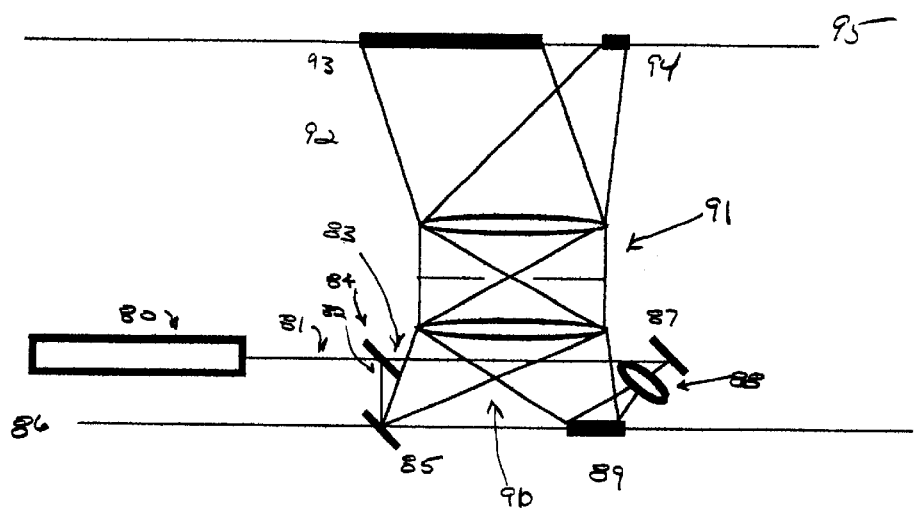
FIG. 9 is a schematic diagram of another preferred embodiment of the present invention.

Another preferred embodiment of an apparatus for reference distribution aerial imaging is illustrated in FIG. 9. A stable continuous wave laser 80 that operates in the $TEM_{00}$ mode is utilized. A beam 81 of coherent quasi-monochromatic light which is linearly polarized perpendicular to the plane of FIG. 9 is produced by the laser. The laser beam is split into two beams, a reference beam 82 and an illumination beam 83, by a variable beam splitter 84.

The reference beam is reflected off reference point reflector 85 in the object plane 86. The illumination beam is reflected from a mirror 87 to a lens 88 that focuses it on the subject 87 in the object plane 86. The illumination beam reflected off subject 87 and the reference beam reflected off the reference point reflector 85 form a propagating optical disturbance on the side of the object plane 86 nearest to an imaging system 91. The propagating optical disturbance propagates toward the imaging system 91. A portion of this optical disturbance arrives at the imaging system 91, which images (enlarges, leaves unchanged or reduces) it. This portion of the optical disturbance subsequently propagates through the imaging system 91. Some of this portion of the propagating optical disturbance 92 ultimately forms a subject distribution aerial image 93 and a reference distribution aerial image 94 at and near the image plane 95.

Reference distribution aerial imaging involves light which is transmitted through or reflected both from a subject and a reference distribution. Four combinations of such transmission and reflection, each of which corresponds to a unique apparatus configuration, can be identified. Aerial images (enlarged, unchanged or reduced) of subjects can be produced by means of reference distribution aerial imaging. Each of the four apparatus configurations can be used in conjunction with each of these types of imaging. Thus, a total of twelve combinations of imaging and apparatus configurations exist.

Apparatus configurations which are suitable for microscopy and microimagery are of particular interest. Microscopy which uses reflection for both the subject and reference distribution (a point reflector rather than a pinhole is used for a reference distribution source) is illustrated schematically in FIG. 9. Microimagery which uses transmission for both the subject and reference is illustrated schematically in FIG. 8. Microscopy which uses transmission for both the subject and reference distribution is also possible.

VI. Aerial Image Formation Region

Each plane wave pair that contributes to aerial image formation propagates through the image plane. These plane wave pairs also propagate through various planes that are parallel to the image plane. The plane wave pairs overlap on each of these planes. As a result, sinusoidal components that closely approximate corresponding sinusoidal components on the image plane are formed on planes that are parallel to and sufficiently near the image plane. These sinusoidal components exist on both sides of the image plane and are considered to be part of the aerial image.

The amplitude of the sinusoidal aerial image components which form on planes that are parallel to the image plane vary with increasing distance from the image plane. For locations sufficiently near the image plane, these amplitudes all decrease with increasing distance from the image plane. The rate of such decrease becomes more pronounced as the spatial period of the sinusoidal aerial image components becomes smaller.

With the exceptions of their lateral extents and amplitudes, the sinusoidal aerial image components which form on planes which are parallel to the image plane are the same as their counterparts on the image plane. All of the sinusoidal aerial image components, both on and off the image plane, are rotated and shifted relative to one another in the same complicated way.

Figure 10:
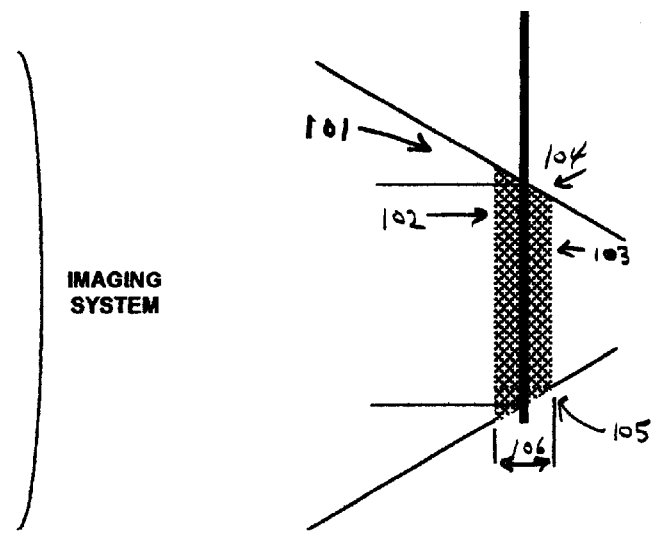
FIG. 10 is a schematic diagram of an image cell.

As shown in FIG. 10, a three dimensional region, designated as an image cell 101, is associated with the spatial period of the various sinusoidal aerial image components which share that spatial period. Such an image cell contains the image area associated with the spatial period. An image cell is bounded by two faces (plane surfaces of finite extent) 102 and 103, which are connected by beveled edges 104 and 105. Sinusoidal components associated with a spatial period contribute significantly to aerial image formation inside but not outside the image cell they are associated with. The faces 102 and 103 of an image cell are parallel to the image plane and they are located equidistant from and on opposite sides of the image plane. The face 102 of an image cell which is nearest to the imaging system is the image cell's major face; the face 103 of an image cell which is furthest from the imaging system is the image cell's minor face. An image cell's major face is larger than its minor face. Finally, an image cell's cell thickness is the distance between its two faces.

An image cell's beveled edges 104 and 105 exist because the two members of a plane wave pair propagate toward each other. Consequently, the area within which a plane wave pair overlaps decreases with increasing distance from the imaging system. The cell thickness 106 of an image cell associated with a spatial period is larger for large spatial periods than it is for small spatial periods. Furthermore, the lateral extent of the minor face 103 of an image cell associated with a spatial period is larger for large spatial periods than it is for small spatial periods.

Figure 11:
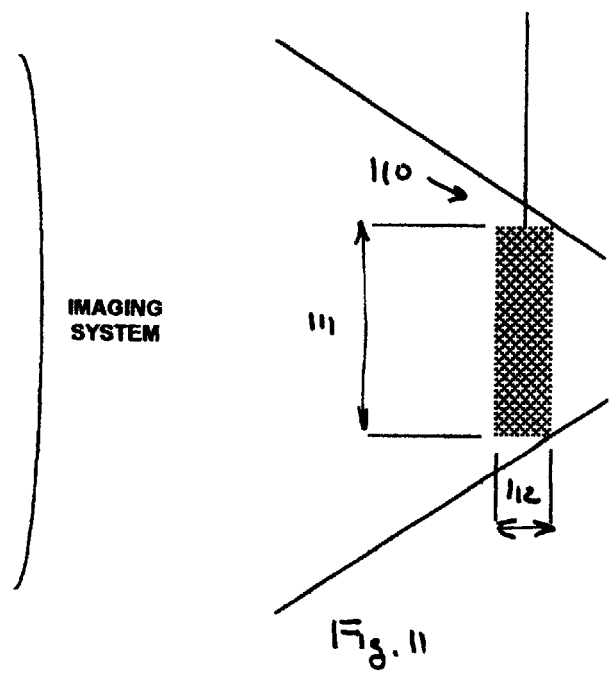
FIG. 11 is a schematic diagram of an aerial image formation region.

As shown in FIG. 11, aerial image formation occurs within a three dimensional region 110 that is characterized by an image field 111 and a depth of field 112. Parallel to the image plane, an aerial image extends over an area known as its image field. Perpendicular to the image plane, an aerial image extends for a distance known as its depth of field 112. The three dimensional region is the aerial image formation region 110.

An aerial image formation region is associated with a particular spatial period which is designated as the aerial image's primary spatial period. The primary spatial period of an aerial image is associated with an image cell which is designated as the primary image cell.

An aerial image formation region is the portion of a primary image cell which remains after replacing the primary image cell's beveled edge with an edge which is perpendicular to the image plane; the edge is located at the boundary of the primary image cell's minor face. The image field and the primary image cell's minor face are equal while the depth of field is the same as the primary image cell's thickness. An aerial image formation region's image field and depth of field are both larger for large primary spatial periods than they are for small primary spatial periods.

The present invention has been particularly shown and described above with reference to various preferred embodiments, implementations and applications. The invention is not limited, however, to the embodiments, implementations or applications described above, and modification thereto may be made within the scope of the invention.

What is claimed is:

1. A method for reference distribution aerial imaging of a subject comprising:

splitting a coherent laser beam into an illumination beam and a reference beam;

expanding and collimating the illumination beam, passing a portion of the illumination beam through a subject in an object plane, and forming a subject distribution from said portion of the illumination beam;

passing a portion of the reference beam through a preformed pinhole in the object plane, and forming a reference distribution from said portion of the reference beam; and combining an aerial image of the subject distribution and an aerial image of the reference distribution on an image plane thereby improving aerial image resolution.

2. The method of claim 1 wherein all points in the subject distribution are separated from all points in the reference distribution at least by a distance, which exceeds a desired resolution limit.

3. The method of claim 2 wherein all points in the subject distribution are separated from all points in the reference distribution at least by a spatial period cutoff.

4. The method of claim 1 wherein the illumination beam and the reference beam remain substantially coherent.

5. A method for reference distribution aerial imaging of a subject comprising:

splitting a coherent laser beam into an illumination beam and a reference beam;

expanding and collimating the illumination beam, passing a portion of the illumination beam through a subject in an object plane, and forming a subject distribution from said portion of the illumination beam;

reflecting a portion of the reference beam from a preformed point reflector in the object plane, and forming a reference distribution from said portion of the reference beam; and combining an aerial image of the subject distribution and an aerial image of the reference distribution on an image plane thereby improving aerial image resolution.

6. A method for reference distribution aerial imaging of a subject comprising:

splitting a coherent laser beam into an illumination beam and a reference beam;

expanding and collimating the illumination beam, reflecting a portion of the illumination beam from a subject in an object plane, and forming a subject distribution from said portion of the illumination beam;

passing a portion of the reference beam through a preformed pinhole in the object plane, and forming a reference distribution from said portion of the reference beam; and combining an aerial image of the subject distribution and an aerial image of the reference distribution on an image plane thereby improving aerial image resolution.

7. The method of claim 6, wherein the coherent laser beam is propagating plane waves of light.

8. A method for reference distribution aerial imaging of a subject comprising:

splitting a coherent laser beam into an illumination beam and a reference beam;

expanding and collimating the illumination beam, reflecting a portion of the illumination beam from a subject in an object plane, and forming a subject distribution from said portion of the illumination beam;

reflecting a portion of the reference beam from a preformed point reflector in the object plane, and forming a reference distribution from said portion of the reference beam; and combining an aerial image of the subject distribution and an aerial image of the reference distribution on an image plane thereby improving aerial image resolution.

9. The method of claim 8 wherein all points in the subject distribution are separated from all points in the reference distribution at least by a distance, which exceeds a desired resolution limit.

10. The method of claim 9 wherein all points in the subject distribution are separated from all points in the reference distribution at least by a spatial period cutoff.

11. An apparatus for reference distribution aerial imaging of a subject, comprising:

means for splitting one coherent laser beam into an illumination beam and a reference beam;

means for expanding and collimating the illumination beam, means for passing a portion of the illumination beam through a subject in an object plane and forming a subject distribution from said portion of the illumination beam;

means for passing a portion of the reference beam through a preformed pinhole in the object plane and forming a reference distribution from said portion of the reference beam; and means for combining an aerial image of the subject distribution and an aerial image of the reference distribution on an image plane thereby improving aerial image resolution.

12. An apparatus for reference distribution aerial imaging of a subject, comprising:

means for splitting one coherent laser beam into an illumination beam and a reference beam;

means for expanding and collimating the illumination beam, means for passing a portion of the illumination beam through a subject in an object plane and forming a subject distribution from said portion of the illumination beam;

means for reflecting a portion of the reference beam from a preformed point reflector in the object plane and forming a reference distribution from said portion of the reference beam; and means for combining an aerial image of the subject distribution and an aerial image of the reference distribution on an image plane thereby improving aerial image resolution.

13. An apparatus for reference distribution aerial imaging of a subject, comprising:

means for splitting one coherent laser beam into an illumination beam and a reference beam;

means for expanding and collimating the illumination beam, means for reflecting a portion of the illumination beam from a subject in an object plane and forming a subject distribution from said portion of the illumination beam;

means for passing a portion of the reference beam through a preformed pinhole in the object plane and forming a reference distribution from said portion of the reference beam; and means for combining an aerial image of the subject distribution and an aerial image of the reference distribution on an image plane thereby improving aerial image resolution.

14. An apparatus for reference distribution aerial imaging of a subject, comprising:

means for splitting one coherent laser beam into an illumination beam and a reference beam;

means for expanding and collimating the illumination beam, means for reflecting a portion of the illumination beam from a subject in an object plane and forming a subject distribution from said portion of the illumination beam;

means for reflecting a portion of the reference beam from a preformed point reflector in the object plane and forming a reference distribution from said portion of the reference beam; and means for combining an aerial image of the subject distribution and an aerial image of the reference distribution on an image plane thereby improving aerial image resolution.

15. An apparatus for reference distribution aerial imaging of a subject comprising:

a laser producing a coherent light beam;

a beam splitter to split the light beam into an illumination beam and a reference beam;

an expanding lens and collimating lens to through which a portion of the illumination beam is passed;

a subject in an object plane through which said portion of the illumination beam is passed to form a subject distribution;

a preformed reference pinhole in the object plane through which a portion of the reference beam is passed to form a reference distribution;

an imaging system to combine an aerial image of both the subject distribution and the reference distribution on an image plane thereby improving aerial image resolution.

16. An apparatus for reference distribution aerial imaging of a subject comprising:

a laser producing a coherent light beam;

a beam splitter to split the light beam into an illumination beam and a reference beam;

an expanding lens and collimating lens through which a portion of the illumination beam is passed;

a subject in an object plane through which said portion of the illumination beam is passed to form a subject distribution;

a preformed reference point reflector in the object plane from which a portion of the reference beam is reflected to form a reference distribution;

an imaging system to combine an aerial image of both the subject distribution and the reference distribution on an image plane thereby improving aerial image resolution.

17. An apparatus for reference distribution aerial imaging of a subject comprising:

a laser producing a coherent light beam;

a beam splitter to split the light beam into an illumination beam and a reference beam;

an expanding lens and collimating lens through which a portion of the illumination beam is passed;

a subject in an object plane from which said portion of the illumination beam is reflected to form a subject distribution;

a preformed reference pinhole in the object plane through which a portion of the reference beam is passed to form a reference distribution;

an imaging system to combine an aerial image of both the subject distribution and the reference distribution on an image plane thereby improving aerial image resolution.

18. An apparatus for reference distribution aerial imaging of a subject comprising:

a laser producing a coherent light beam;

a beam splitter to split the light beam into an illumination beam and a reference beam;

an expanding lens and collimating lens through which a portion of the illumination beam is passed;

a subject in an object plane from which said portion of the illumination beam is reflected to form a subject distribution;

a preformed reference point reflector in the object plane from which a portion of the reference beam is reflected to form a reference distribution;

an imaging system to combine an aerial image of both the subject distribution and the reference distribution on an image plane thereby improving aerial image resolution.

* * * * *